United States Patent [19]
Sarin et al.

[11] Patent Number: 5,798,967
[45] Date of Patent: Aug. 25, 1998

[54] SENSING SCHEME FOR NON-VOLATILE MEMORIES

[75] Inventors: Vishal Sarin, Santa Clara; Vikram Kowshik, San Jose; Andy Teng-Feng Yu, Palo Alto, all of Calif.

[73] Assignee: Programmable Microelectronics Corporation, San Jose, Calif.

[21] Appl. No.: 801,414

[22] Filed: Feb. 22, 1997

[51] Int. Cl.[6] ............................................. G11C 16/06
[52] U.S. Cl. ...................... 365/185.21; 365/185.23; 365/185.25; 365/189.09; 365/233.5
[58] Field of Search ...................... 365/185.21, 185.23, 365/185.25, 189.09, 233.5

[56] References Cited

U.S. PATENT DOCUMENTS

| | | | |
|---|---|---|---|
| 5,138,579 | 8/1992 | Tatsumi et al. | 365/185.21 |
| 5,177,707 | 1/1993 | Edme | 365/185.25 |
| 5,197,023 | 3/1993 | Nakai | 365/185.21 |
| 5,353,249 | 10/1994 | Itano | 365/233.5 |
| 5,386,158 | 1/1995 | Wang | 365/185.21 |
| 5,390,147 | 2/1995 | Smarandoiu et al. | 365/189.09 |
| 5,428,570 | 6/1995 | Iwahashi | 365/185.21 |
| 5,519,652 | 5/1996 | Kumakura et al. | 365/233.5 |
| 5,559,737 | 9/1996 | Tanaka et al. | 365/185.21 |
| 5,627,790 | 5/1997 | Gulla et al. | 365/185.25 |

*Primary Examiner*—Joseph E. Clawson, Jr.
*Attorney, Agent, or Firm*—Flehr Hohbach Test Albritton & Herbert LLP; William L. Paradice, III

[57] ABSTRACT

A sensing circuit charges the bit lines of an associated memory array using one or more large-area pass transistors during reading operations of a selected memory cell of the memory array. In this manner, the read speed of the memory array is independent of the channel current of the memory cell. A sink transistor sinks a constant current from the selected bit line during reading to improve the noise margin of the sensing circuit so that memory arrays associated with the sensing circuit do not require the reference bit lines.

19 Claims, 3 Drawing Sheets

SENSING SCHEME FOR NON-VOLATILE MEMORIES

CROSS REFERENCE TO RELATED APPLICATIONS

This application is related to the U.S. Pat. application Ser. No. 08/557,589 entitled "A PMOS Memory Cell with Hot Electron Injection Programming and Tunnelling Erasing" filed on Nov. 13, 1995.

BACKGROUND

1. Field of Invention

This invention relates generally to arrays of non-volatile memory cells and specifically to circuits for sensing whether such memory cells are in a programmed state or in an erased state.

2. Description of Related Art

Conventional sensing circuits typically determine whether a non-volatile memory cell is in a programmed state or an erased state by comparing the difference between the channel current in the cell selected for reading with the channel current in a reference cell. The reference cell is typically of a size and characteristics such that the reference cell conducts a channel current approximately one half of the channel current of the memory cell. For instance, a reference cell conducts 50 microamps of channel current and a programmed memory cell conducts 100 microamps of channel current. During read operations, a read voltage is applied to the respective control gates of the selected memory cell and the reference cell. The resulting channel currents in the selected memory cell and the reference cell are then converted to a differential voltage indicative of the binary state of the memory cell.

A conventional sensing circuit 10 operating in accordance with that described above is shown in FIG. 1 and described below with reference to a bit addressable memory array 50 containing a plurality PMOS memory cells 52. Cells 52, each of which includes a P-channel select transistor 52a and a P-channel floating gate storage transistor 52b, in a common column are coupled to an associated one of bit lines BLx. Cells 52 may be of the type disclosed in the above-referenced co-pending Patent Application entitled "A PMOS Memory Cell with Hot Electron Injection Programming and Tunnelling Erasing". When in a programmed state, cells 52 typically conduct approximately 100 microamps. Array 50 includes reference cells 54 coupled to one or more associated reference bit lines DBLX. Reference cells 54, each of which includes a P-channel select transistor 54a and a P-channel floating gate transistor 54b, remain in a state so as to conduct approximately 50 microamps of channel current. Note that page buffers and other appropriate address decode circuitry have been omitted from array 50 for clarity.

The gates of select transistors 52a and reference transistors 54a in a common row are coupled to a select gate line SG0 and the gates of cells 52b and reference cells 54b in a common row are coupled to a word line WL0 (only two rows of array 50 are shown for simplicity). The sources of each of storage transistors 52b and 54b are coupled to a common source node CS.

The selected bit lines BLx of array 50 are coupled to a sensing node SNODE via the decode circuitry (not shown) and an access transistor T3. SNODE is coupled to ground potential through a diode-connected transistor T4. The reference bit lines DBLX are coupled to a reference node REFNODE via an access transistor T5. REFNODE is coupled to ground potential through a diode-connected transistor T6. PMOS transistor T10, in response to an enabling signal EN, sources current to the current mirror formed by transistors T8 and T9, thereby establishing bias currents in differential transistors T1 and T2. The source of transistor T1, hereinafter referred to as output node OUT, is coupled to a conventional latch circuit 12. An output terminal of latch circuit 12 is coupled to an output driver circuit (not shown for clarity). A bias transistor T7 is coupled across the gates of transistors T1 and T2 and has a gate coupled to receive a control signal BIAS. Bias transistor T7 ensures that the gate voltages of transistors T1 and T2 are equal prior to reading operations, thereby "initializing" the differential input stage formed by transistors T1 and T2.

Sensing circuit 10 determines the binary state of a selected memory cell 52 as follows. During read operations, bit lines BLx and reference bit lines DBLX are discharged to approximately ground potential. A signal SG on line GS0 transitions to a low logic voltage to turn on select transistors 52a and reference select transistors 54a in the selected row. A signal CG on line CG0 transitions to a voltage approximately between ground potential and $V_{CC}$. Reference cells 54b conduct a channel current so as to charge reference bit line DBL0 to a predetermined reference voltage $V_{ref}$. If programmed, selected memory cell 52b conducts a channel current of approximately 100 microamps and charges its bit line BL0 to a high voltage, $V_H$, where $V_H > V_{ref}$. The voltage differential $V_{H-Vref}$ appears across the gates of differential transistors T1 and T2 via nodes SNODE and REFNODE, respectively. In response thereto, transistor T1 turns on harder than transistor T2 and causes the voltage OUT to fall below the trip point of latch circuit 12 which, in turn, provides an output signal indicative of the programmed state of selected memory cell 52. If, on the other hand, selected cell 52 is in an erased state, the voltage on bit line BL0 will be less than the voltage on reference bit line DBL0 and, thus, the voltage at node SNODE is $V_L$, where $V_L < V_{ref}$. In response to the voltage differential $V_L - V_{ref}$, transistor T2 turns on harder than transistor T1, thereby allowing the output voltage OUT to rise above the trip point of latch circuit 12. As the voltage OUT exceeds the trip point, latch circuit 12 cause its output signal to transition logic states, thereby indicating that selected memory cell 52b is in an erased state.

Sensing circuits of the type described above have several disadvantages. One such disadvantage is an undesirably low noise margin $V_{noise}$. The noise margin $V_{noise}$ is the difference between the minimum voltage at SNODE required to detect a programmed cell 52 and the maximum voltage required at SNODE to detect an erased cell 52. If selected cell 52 is programmed, the voltage at SNODE equals the threshold voltage of transistor T4 plus a first predetermined voltage, i.e., $V_H = V_T + V_{D1}$. If selected cell 52 is not programmed, the voltage at SNODE equals the threshold voltage of transistor T4 plus a second predetermined voltage, i.e., $V_L = V_T + V_{D2}$, where $V_{D1} > V_{D2}$. The noise margin $V_{noise}$ is equal to $V_{D2} - V_{D1}$ and may be undesirably small so as to allow noise such as, for instance, ground bounce, to interfere with accurate transitions of differential pair transistors T1 and T2. Reference bit lines DBLx and associated reference cells 54 are thus required in order to decrease the noise to an acceptable level. However, the inclusion of such reference bit lines and reference cells undesirably increases the complexity, cost and surface area of an associated memory array such as, for instance, array 50.

In addition to undesirably requiring reference bit lines, sensing circuit 10 facilitates charging of the bit lines BLx by inducing channel current in selected memory cells 52. The reference bit lines are charged in a similar manner. As a result, the access time, or read speed, of a memory array associated with sensing circuit 10 is dependent upon the channel current within the memory cells (and reference cells) of the memory array. Thus, since reducing the size of the memory cells results in a lower channel current therein, reducing the size of the memory cells undesirably results in an increase in access time. Further, since increasing the number of memory cells per bit line increases the capacitance on the bit line and thus increases the time required to charge the bit line, increasing the size of the associated memory array also limits access time.

SUMMARY

A sensing circuit is disclosed herein which overcomes problems in the art described above. In accordance with the present invention, the sensing circuit charges the bit lines of an associated memory array using one or more large-area pass transistors. In this manner, the read speed of the memory array is independent of the channel current of the memory cells within the memory array. Further, a sink transistor is provided to sink a constant current from the selected bit lines during reading operations. This sink current is less than the channel current conducted by a selected memory cell of the memory array when the selected cell is in a programmed state and significantly improves the noise margin of the sensing circuit. As a result, sensing circuits in accordance with the present invention allow for the elimination of reference cells and corresponding reference bit lines from the memory array associated with the sensing circuit.

DETAILED DESCRIPTION

A sensing circuit in accordance with the present invention is described below in the context of a memory array 70 for clarity and convenience only; embodiments of the present invention are equally applicable for reading data from memory arrays containing other well known memory cells and having various other well known suitable array configurations. Further, it is to be understood that the description that follows is merely illustrative of the present invention and should not be construed in a limiting manner.

Figure 1:
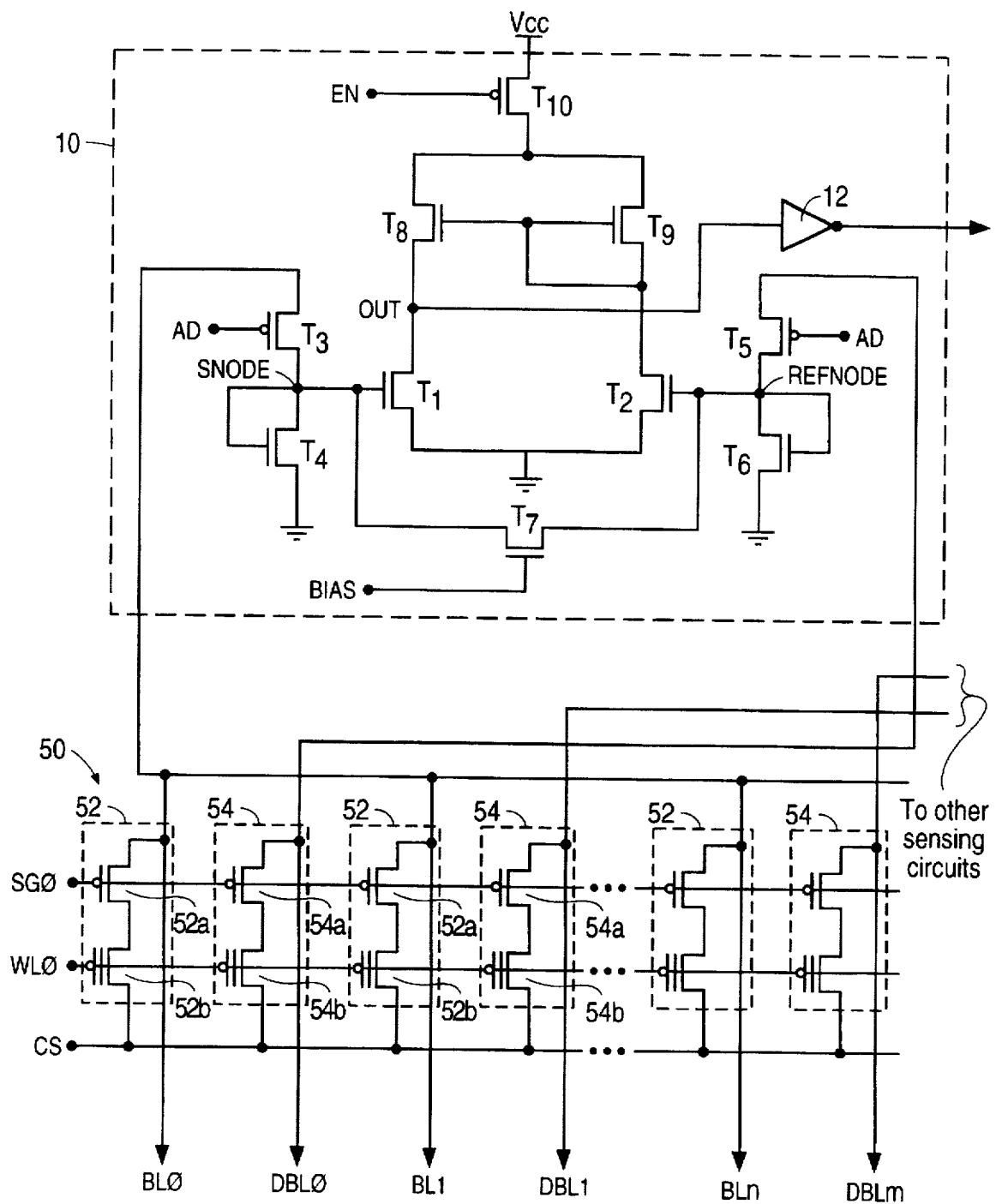
FIG. 1 includes a schematic diagram of a conventional sensing circuit.
Figure 2:
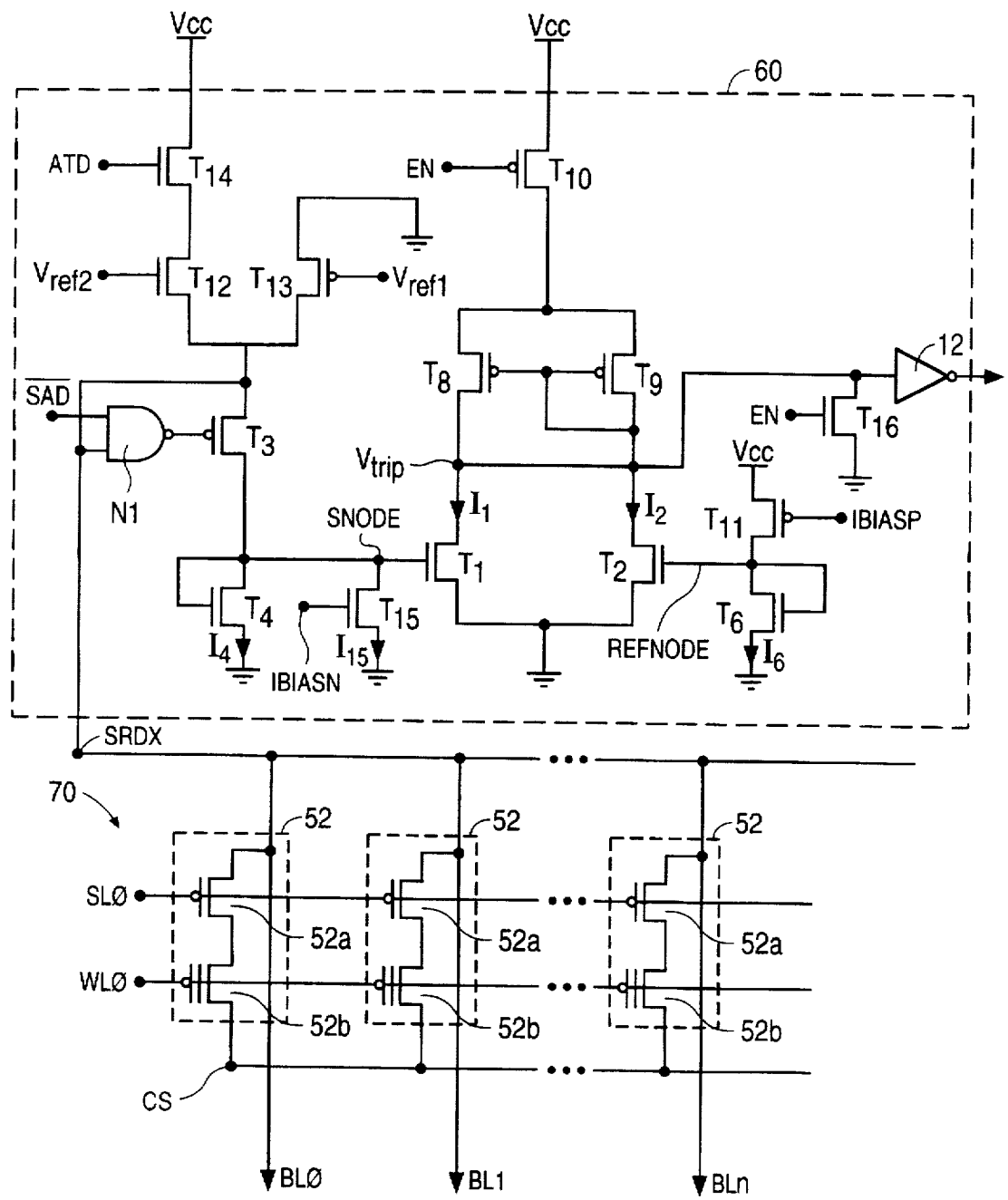
FIG. 2 includes a schematic diagram of a sensing circuit in accordance with the present invention.

Referring to FIG. 2, sensing circuit 60 is configured to determine the binary state of selected ones of memory cells 52 of bit-addressable memory array 70, where those elements common to the circuits of FIGS. 1 and 2 are similarly denoted. Unlike memory array 50 of FIG. 1, array 70 contains neither reference bit lines nor reference cells. Note that page buffers and other appropriate address decode circuitry have been omitted from array 70 for clarity. The differential pair formed by transistors T1 and T2 responds to differences between the voltage on a selected bit line BLx at SNODE and a predetermined reference voltage $V_{ref}$ at REFNODE. The bit lines BLx of memory array 70 and the drain of PMOS access transistor T3 of circuit 60 are coupled together at a common node SRDX via the decode circuitry (not shown). The voltage at node SRDX, i.e., the bit line voltage, is coupled to the gate of transistor T1, i.e., SNODE, via access transistor T3. The gate of transistor T3 is coupled to the output terminal of a NAND gate N1 having a first input terminal coupled to node SRDX and a second input terminal coupled to receive a select address signal SAD. Coupled between the gate of transistor T1 and ground potential are diode-connected transistor T4 and a constant current sink NMOS transistor T15. The gate of sink transistor T15 is coupled to receive a bias signal IBIASN.

The gate of transistor T2 is coupled to ground via diode-connected transistor T6. A PMOS bias transistor T11 is coupled between the gate of transistor T2 and $V_{CC}$, and has a gate coupled to receive a bias signal IBIASP. As will be explained below, the signal IBIASP sets up reference voltage $V_{ref}$ at the gate of transistor T2.

The source of an NMOS transistor T12 and the drain a PMOS transistor T13 are coupled to the source of access transistor T3 and thus to node SRDX. The source of transistor T13 is coupled to ground potential, and the gate of transistor T13 is coupled to receive a reference voltage $V_{ref1}$. The drain of an NMOS transistor T12 is coupled to the source of an NMOS pass transistor T14, and the gate of transistor T12 is coupled to receive a reference voltage $V_{ref2}$. For purposes of discussion herein, $V_{ref1}$ and $V_{ref2}$ are approximately 1.2 volts and approximately 2.2 volts, respectively. The gate of pass transistor T14 is coupled to receive an address transition detection signal ATD, and the drain of transistor T14 is coupled to $V_{CC}$.

The operation of circuit 60 is as follows. Signal IBIASP induces a current $I_6$ of approximately 2 microamps in transistor T11 and diode-connected transistor T6 which, in turn, results in $V_{ref}$ being equal to approximately 0.8 volts. In other embodiments, transistors T6 and T11 may be replaced by other suitable reference circuits. When reading a selected one of cells 52, signal SAD transitions high and signal ATD is pulsed to a logic high level of, for instance, approximately 3 volts, for between approximately 10–15 nanoseconds. Node SRDX and thus bit lines BLx are rapidly charged to a predetermined bit line voltage $V_{BL}$. In preferred embodiments, transistors T12 and T14 are large-area transistors capable of conducting a current on the order of several milliamps so as to quickly to charge bit lines BLx. Presuming a threshold voltage VT for transistor T12 of approximately 0.7 volts, $V_{BL}$ should be equal to approximately one threshold voltage below $V_{ref2}$, i.e., $V_{BL}=2.2-V_T=1.5$ volts. PMOS transistor T13 limits the voltage $V_{BL}$ to approximately one threshold voltage above $V_{ref1}$, i.e., approximately 1.9 volts.

As the voltage on node SRDX, i.e., $V_{BL}$, increases above approximately 1.2 volts, NAND gate N1 outputs a logic low signal and thereby turns on transistor T3. Node SNODE, and thus node SRDX, charges to approximately 1.5 volts. Thus, bit lines BLx may be charged without using the channel current of memory cell 52. Accordingly, the time required to charge the it lines BLx is independent of the size of cell 52 and, as a result, decreasing the size of memory cell 52 will not adversely affect the speed with which cells 52 of memory array 70 are read.

With the voltage at SNODE equal to approximately 1.5 volts and the voltage at REFNODE equal to approximately 0.8 volts, transistor T3 turns on much harder than transistor T4, thereby pulling the trip voltage $V_{trip}$ at the drain of transistor T1 towards ground potential. In response thereto, latch 12 outputs a logic low signal. Note that in other embodiments latch 12 may be replaced by any suitable circuit which transitions the logic state of its output signal in response to the trip voltage $V_{trip}$ crossing a predetermined threshold voltage.

Figure 3A:
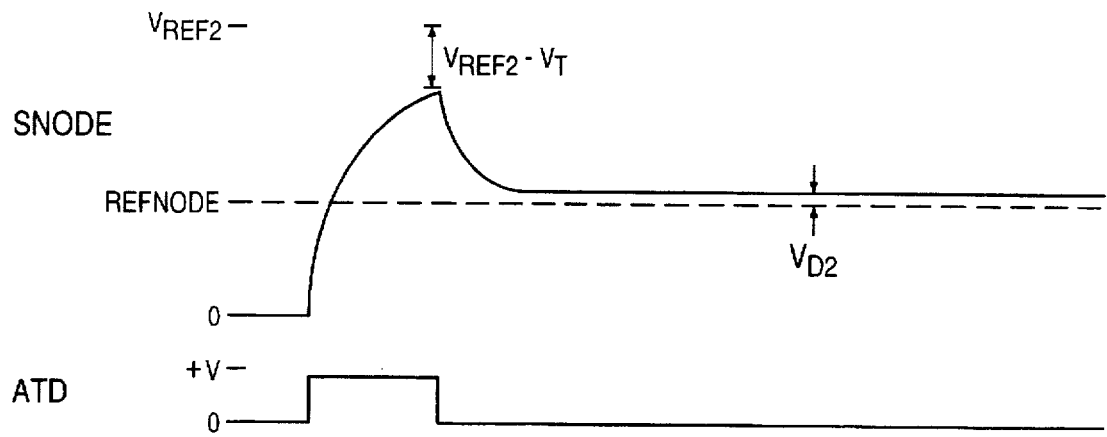
FIGS. 3A and 3B are timing diagrams illustrating various node potentials of the sensing circuit shown in FIG. 2 during reading operations.
Figure 3B:
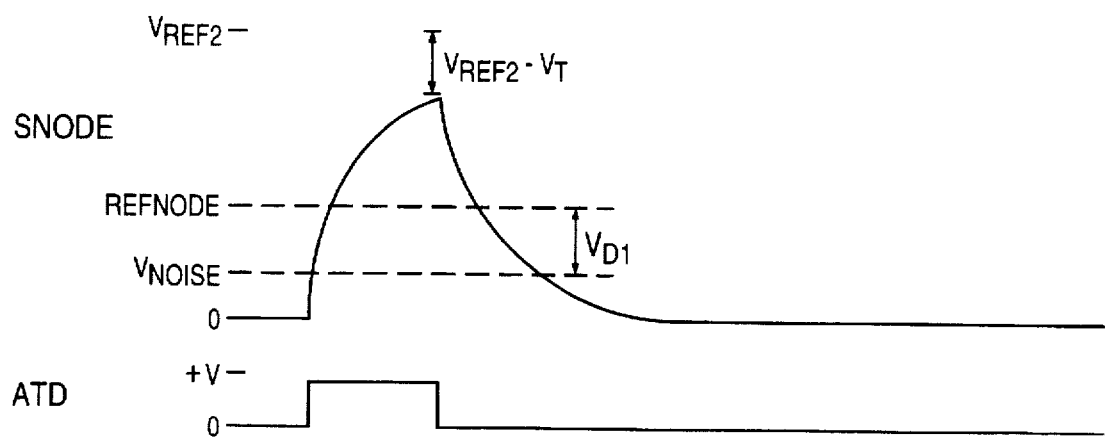

As soon as the high pulse of signal ATD is complete, SNODE rapidly discharges through diode-connected transistor T4. In preferred embodiments, transistor T4 is a large area transistor capable of conducting a current on the order of a few hundred amps. Appropriate read voltages are provided on select line SL0, word line WL0, and to common source CS of memory array 70. Such read voltages are disclosed, for instance, in the above-referenced patent application entitled "A PMOS Memory Cell with Hot Electron Injection Programming and Tunnelling Erasing". If in a programmed state, the one of cells 52 selected for reading by the address decode circuitry (not shown) sources approximately 10 microamps to SNODE via selected bit line BLx so as to prevent SNODE from discharging below approximately 0.9 volts. Thus, the voltage at SNODE remains higher than the voltage at REFNODE and, as a result, voltage $V_{trip}$ remains below the threshold of latch 12. Accordingly, latch 12 continues to output a logic low signal, thereby indicating that the selected one of cells 52 is in a programmed state. The potentials of SNODE and signal ATD when selected cell 52 is in a programmed state are shown in FIG. 3A.

If, on the other hand, in an erased state, the cell 52 selected for reading will not source current to SNODE and, as a result, SNODE discharges to approximately 0 volts. Since the voltage at SNODE is less than the voltage at REFNODE, transistor T2 turns harder than transistor T1 and, as a result, the voltage $V_{trip}$ rises to approximately 3 volts. With the threshold voltage of latch 12 set to approximately 1.5 volts using well known techniques, the output signal of latch 12 transitions to a logic high state, thereby indicating that the one of cells 52 selected for reading is in an erased state. The potentials of SNODE and signal ATD when selected cell 52 is in an erased state are shown in FIG. 3A.

As the voltage of SNODE approaches 0.7 volts during reading of a cell 52 that is in an erased state, diode-connected transistor T4 begins to turn off since the threshold voltage of transistor T4 is equal to approximately 0.7 volts. Thus, the discharging rate of SNODE decreases as the voltage of SNODE approaches 0.7 volts, thereby undesirably limiting the discharge rate of SNODE and thus undesirably limiting the read speed of cells 52 of memory array 70. In order to compensate for the turning off of transistor T4, sink transistor T15 is coupled in parallel with transistor T4 between SNODE and ground potential. Signal IBIASN is maintained at approximately 0.8 volts so that transistor T15 remains in a conductive state even when SNODE approaches 0.7 volts. In some embodiments, transistor T15 is preferably of a size to conduct a current $I_{15}$ of approximately between 3–4 microamps and is biased by a well known bandgap referenced current mirror. If the current through the selected cell 52 is greater than $I_6+I_{15}$, latch 12 will output a logic low signal indicative of selected cell 52 being in a programmed state and, conversely, if the current through the selected cell 52 is less than $I_6+I_{15}$, latch 12 will output a logic high signal indicative of selected cell 52 being in a erased state. Thus, when circuit 60 is reading an erased cell 52 of memory array 70, transistor T15 allows SNODE to discharge more quickly to ground potential, thereby compensating for limiting of the discharge rate of SNODE caused by the turning off transistor T4 when SNODE approaches 0.7 volts.

The operation of circuit 60 as described above allows for a noise margin superior to that of conventional sensing circuits of the type described above with reference to FIG. 1. The noise margin for circuit 70, $V_{noise}$, may be expressed as:

$$V_T+V_{D2}-(V_T-V_{D1})=V_{D2}+V_{D1}$$

where $V_T$ is the threshold voltage of transistors T4 and T6, $V_{D1}$ is the underdrive voltage on the gate of transistor T4 when selected cell 52 in an erased state, and $V_{D2}$ is the overdrive voltage on the gate of transistor T4 when selected cell 52 in a programmed state.

The noise margin $V_{noise}$ of circuit 60 is equal to the sum of incremental voltages $V_D$ and $V_{D2}$, thereby allowing for a greater noise margin than the noise margin of conventional sensing circuits of the type shown in FIG. 1 since, as discussed above, the noise margin of such conventional sensing circuits is equal to the difference of incremental voltages $V_{D1}$ and $V_{D2}$. In some embodiments, the values of $V_T$, $V_{D1}$, and $V_{D2}$ are approximately 0.7, 0.3, and 0.2 volts, respectively, so to give a noise margin of approximately 500 millivolts. This improved noise margin of circuit 60 allows circuit 60 to accurately sense the binary state of cells 52 of memory array 70 without requiring memory array 70 to contain reference cells and reference bits lines to generate a reference voltage at REFNODE. Thus, the employment of sensing circuit 60 within a memory system allows for the use of smaller memory arrays such as memory array 70.

A transistor T16 is coupled between the drain of transistor T1 and ground potential and has a gate coupled to receive signal EN. Transistor T16 ensures that during the first portion of the read cycle, i.e. when bit lines BLx are charged to approximately 1.5 volts by transistors T12 and T14, the trip voltage $V_{trip}$ remains at ground potential and thereby ensures that the differential pair T1 and T2 is properly calibrated.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. In particular, the principles described above are equally applicable to memory arrays which employ NMOS memory cells.

We claim:

1. A sensing circuit for determining the binary state of a memory cell within a memory array, said sensing circuit comprising:

a differential stage having a first input terminal coupled to a sense node, a second input terminal coupled to receive a first reference voltage, and an output terminal;

coupling means connecting said sense node to a bit line associated with said memory cell;

a charging transistor having a source coupled to said bit line, a drain coupled to receive a supply voltage, and a gate coupled to receive a second reference voltage, said charging transistor charging said bit line to a bit line voltage during reading of said memory cell; and a latch having an input terminal coupled to said output terminal of said differential stage and having an output terminal for providing an output signal indicative of the binary state of said memory cell.

2. The circuit of claim 1, wherein said differential stage comprises a differential transistor pair.

3. The circuit of claim 1, wherein said coupling means comprises a transistor coupled between said bit line and said sense node.

4. The circuit of claim 3, further comprising a NAND gate having a first input terminal coupled to said bit line, a second input terminal coupled to receive a control signal, and an output terminal coupled to a gate of said transistor.

5. The circuit of claim 1, further comprising a sink transistor coupled between said sense node and ground potential and having a gate coupled to receive a bias voltage, said sink transistor sinking a constant current from said sense node.

6. The circuit of claim 5, further comprising a diode-connected transistor coupled between said sense node and ground potential.

7. The circuit of claim 1, further comprising
a pass transistor coupled between said charging transistor and said voltage supply, said pass transistor having a gate coupled to receive an address control signal and, in response to said address control signal, allowing said charging transistor to charge said bit line.

8. The circuit of claim 7, further comprising a limiting transistor coupled between said bit line and ground potential and having a gate coupled to receive a third reference voltage, said limiting transistor preventing the voltage of said bit line from discharging below a first predetermined voltage.

9. The circuit of claim 1, wherein said first reference voltage is generated by a reference circuit comprising:
a first transistor coupled between said second input terminal of said differential stage and said supply voltage and having a gate coupled to receive a bias voltage; and
a diode-connected transistor coupled between said second input terminal of said differential stage and ground potential.

10. A sensing circuit for determining the binary state of a memory cell within a memory array, said sensing circuit comprising:
a differential stage having a first input terminal coupled to a sense node, a second input terminal coupled to receive a first reference voltage, and an output terminal;
coupling means connecting said sense node to a bit line associated with said memory cell;
a sink transistor coupled between said sense node and ground potential and having a gate coupled to receive a bias voltage, said sink transistor sinking a constant current from said sense node; and
a latch having an input terminal coupled to said output terminal of said differential stage and having an output terminal for providing an output signal indicative of the binary state of said memory cell.

11. The circuit of claim 10, wherein said differential stage comprises a differential transistor pair.

12. The circuit of claim 10, wherein said coupling means comprises a transistor coupled between said bit line and said sense node.

13. The circuit of claim 11, further comprising a NAND gate having a first input terminal coupled to said bit line, a second input terminal coupled to receive a control signal, and an output terminal coupled to a gate of said transistor.

14. The circuit of claim 11, further comprising a charging transistor having a source coupled to said bit line, a drain coupled to receive a supply voltage, and a gate coupled to receive a second reference voltage, said charging transistor charging said bit line to a bit line voltage during reading of said memory cell.

15. The circuit of claim 14, further comprising a diode-connected transistor coupled between said sense node and ground potential.

16. The circuit of claim 14, further comprising
a pass transistor coupled between said charging transistor and said voltage supply, said pass transistor having a gate coupled to receive an address control signal and, in response to said address control signal, allowing said charging transistor to charge said bit line.

17. The circuit of claim 16, further comprising a limiting transistor coupled between said bit line and ground potential and having a gate coupled to receive a third reference voltage, said limiting transistor preventing the voltage of said bit line from discharging below a first predetermined voltage.

18. A method for determining the binary state of a non-volatile memory cell selected for reading by a sensing circuit, said method comprising the steps of:
charging a selected bit line associated with said memory cell to a first predetermined voltage using one or more pass transistors within said sensing circuit;
applying a read voltage to said memory cell;
discharging said selected bit line using discharge transistors within said sensing circuit;
comparing the resultant voltage of said bit line to a reference voltage; and
determining, in response to said comparing step, the binary state of said selected memory cell.

19. The method of claim 18, further comprising the step of sinking a constant current from said bit line during the reading of said memory cell.

* * * * *